US008456885B2

(12) United States Patent
Tolmie et al.

(10) Patent No.: US 8,456,885 B2
(45) Date of Patent: Jun. 4, 2013

(54) RANDOM ACCESS MEMORY CIRCUIT

(75) Inventors: Derek Tolmie, Edinburgh (GB); Arnaud Laflaquiere, Edinburgh (GB); Francois Roy, Seyssins (FR)

(73) Assignees: STMicroelectronics (R&D) Ltd., Marlow Bucks (GB); STMicroelectronics (Crolles 2) SAS, Crolles (FR)

( * ) Notice: Subject to any disclaimer, the term of this patent is extended or adjusted under 35 U.S.C. 154(b) by 700 days.

(21) Appl. No.: 12/535,261

(22) Filed: Aug. 4, 2009

(65) Prior Publication Data
US 2010/0061139 A1    Mar. 11, 2010

(30) Foreign Application Priority Data

Aug. 4, 2008  (EP) .................................... 08275042

(51) Int. Cl.
*G11C 11/36* (2006.01)
(52) U.S. Cl.
USPC .... 365/115; 365/155; 365/189.15; 250/208.1
(58) Field of Classification Search
CPC ........ G11C 13/048; G11C 11/36; G11C 7/005; H01L 29/00; H01L 31/00
USPC ................. 365/115, 155, 189.15; 250/208.1; 257/53
See application file for complete search history.

(56) References Cited

U.S. PATENT DOCUMENTS

| 7,119,317 | B2 * | 10/2006 | Ando et al. ................. 250/208.1 |
| 7,369,167 | B2 * | 5/2008 | Bruce et al. .................... 348/308 |
| 7,447,085 | B2 * | 11/2008 | Boemler ................... 365/189.11 |
| 7,586,076 | B2 * | 9/2009 | Silsby ......................... 250/208.1 |
| 2004/0046170 | A1 * | 3/2004 | Roy ............................. 257/53 |
| 2004/0262495 | A1 | 12/2004 | Yuyama |
| 2008/0117319 | A1 | 5/2008 | Jiang et al. ..................... 348/273 |

FOREIGN PATENT DOCUMENTS

| EP | 1 628 468 | 2/2006 |
| EP | 1 780 795 | 5/2007 |
| WO | 2008/036289 | 3/2008 |
| WO | 2008/063419 | 5/2008 |

* cited by examiner

*Primary Examiner* — Toan Le
(74) *Attorney, Agent, or Firm* — Allen, Dyer, Doppelt, Milbrath & Gilchrist, P.A. Attorneys at Law

(57) ABSTRACT

A random access memory circuit includes a plurality of pixels, each having a light sensitive area and a light blocking layer arranged over at least each of the light sensitive areas. In an alternative embodiment, the circuit includes a plurality of memory elements for storing data. Each memory element may comprise a bit node formed between a photodiode, having a light arranged over the photodiode, and a switching element, where data may be stored. The circuit may also include a plurality of reading and writing circuits for reading and writing data to and from the memory cells.

21 Claims, 7 Drawing Sheets

RANDOM ACCESS MEMORY CIRCUIT

FIELD OF THE INVENTION

The present invention relates to memory devices, and, more particularly, to a random access memory circuit comprising an imaging pixel circuit architecture.

BACKGROUND OF THE INVENTION

In today's relatively complex System On Chip (SOC) applications, analog blocks, digital blocks and memories are integrated on the same chip. As SOC devices become more complex, the size of the memories (i.e., number of addresses) increases, with a subsequent increase in chip area to accommodate the memories. Therefore, memories have a significant influence on the overall chip area, and it is desirable to minimize the amount of chip area used by memories to ensure profitability.

Image sensors are manufactured using a pixel cell optimization process. Along with the pixel array, analog blocks, digital blocks and memory are integrated on the same image sensor chip. Currently, the typical memory type used for this application is the standard SRAM (Static Random Access Memory). However, image sensor processes are not optimized for standard SRAM memories, and therefore as the pixel cell continues to shrink, the inability to shrink the SRAM becomes a problem to chip area and profitability.

SUMMARY OF THE INVENTION

According to a first aspect of the present invention, a random access memory circuit may include a plurality of pixels each having a light sensitive area and a light preventing or blocking means arranged over at least each of the light sensitive areas. The circuit may further include a plurality of bit lines for one or more of the pixels. Moreover, the plurality of pixels may be arranged in an array of rows and columns. Further, each of the bit lines may supply a column or row of pixels.

By way of example, the light preventing means may comprise a metal layer. Additionally, each of the plurality of pixels may include at least one bit node for storing data which is formed between a reverse biased photodiode and a transfer switching circuit or means. Each of the plurality of pixels may also include a readout arrangement comprising a sense node formed between an amplifier, a reset switching means and the transfer switch. The readout arrangement may further include a readout switching circuit or means connected to the amplifier. The amplifier may be a source-follower transistor. Further, the readout switch may be connected to the source or the drain of the source-follower transistor.

According to a second aspect, a method of using a plurality of pixels as a random access memory circuit is provided. The plurality of pixels may each have a light sensitive area and a light blocking layer or preventing means arranged over at least each of the light sensitive areas. The method may (i) include writing a set voltage to a bit node between a reverse-biased photodiode and a switching means of each pixel, and (ii) reading the set voltage from the bit node. Step (i) may include turning on the switching means, applying the set voltage across the reversed biased photodiode and turning off the switching means, and storing the set voltage at the bit node. Furthermore, step (ii) may include charging a sense node, located at the side of the switching means opposite that of the photodiode, to a pre-determined voltage, isolating the sense node from further charging, turning on the switching means and detecting the change in the sense node voltage.

According to a third aspect of the present invention, a random access memory circuit may include a plurality of memory elements for storing data. Each memory element may include a bit node formed between a photodiode and having a light preventing means arranged over the photodiode, and a switching element where data may be stored. The memory circuit may further include a plurality of reading and writing means for reading and writing data to and from the plurality of memory cells.

The plurality of reading and writing means may include an enable means and an amplifying means, which together from a sensing node, and the sensing node may be connected to one or more of the switching elements of the memory elements. The enable means may comprise a reset transistor having its source connected to the sensing node. Furthermore, the amplifying means may comprise a unity gain amplifying means. The amplifying means may have a gain of less than unity. The unity gain amplifying means may be a source-follower transistor. Additionally, the plurality of reading and writing means may further comprise a read selection means. Moreover, the plurality of memory elements may be arranged in an array of rows and columns.

BRIEF DESCRIPTION OF THE DRAWINGS

Embodiments of the present invention will now be described, by way of example only, with reference to the drawings, in which.

DETAILED DESCRIPTION OF THE PREFERRED EMBODIMENTS

The description below describes an on-chip RAM memory for processes that have not been optimized for SRAMs (Static RAM). This results in a smaller memory area compared to an equivalent SRAM, and thus a smaller chip area. The development of image sensors is a good example of one application where this invention is particularly advantageous. The memory described uses standard pixel cells to store data, and therefore delivers a memory that is optimized for image sensor processes, although many other applications may benefit from this type of memory as well. One advantage of a memory of this type is a smaller memory area, which translates into a smaller chip area, allowing a greater number of individual chips to be produced per semiconductor wafer.

The following description is intended to demonstrate the basic principle of how a pixel may be used as a memory element. Therefore, factors such as leakage current, charge injection, and noise, among other factors, are not discussed. In practice, a large number of memory elements will be provided in an array, in much the same manner as a pixel array.

Figure 1:
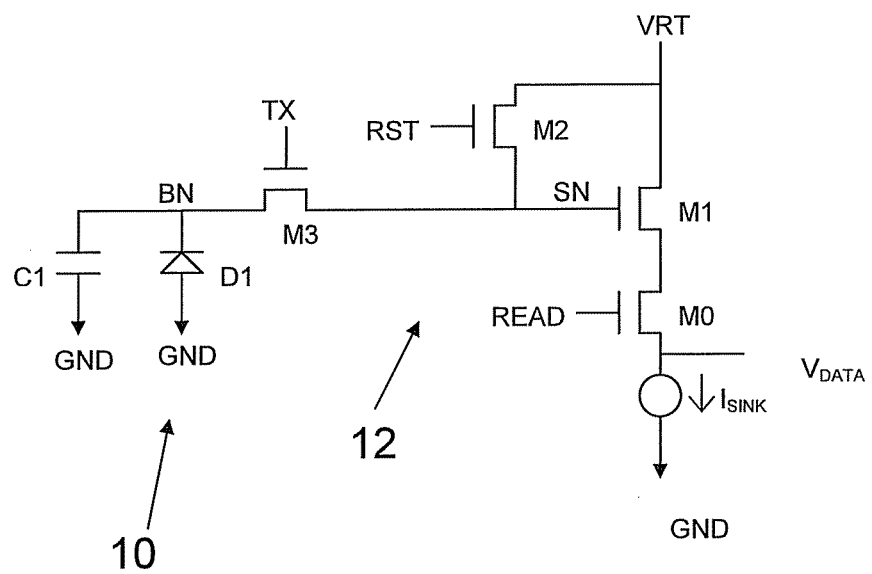
FIG. 1 is a schematic diagram of a memory element having a 4-transistor (4T) pixel layout in accordance with the present invention.

Referring to FIG. 1, a memory cell 10 is shown along with a readout arrangement 12 which utilizes a conventional 4T (4 transistor) pixel layout. A photodiode D1, which is reverse biased, and a transfer gate transistor M3 between them create a bit node BN. A capacitor C1 represents the capacitance associated with D1, but also any additional capacitance that may (or may not) be added in parallel to the node BN. Other transistors include a "read" transistor M0, "reset" transistor M2, and source-follower M1. Between the reset transistor M2, transfer gate transistor M3, and source-follower M1 is a node defined as a sense node SN. The memory cell 10 and readout arrangement 12 are capable of receiving signals TX to control the transfer gate transistor M3, RST to control the reset transistor M2, READ to control the read transistor M0, and VRT which is used to write data to the memory cell 10. VRT may be described as a "bit line", as it is this signal which writes bits to the memory cell 10. The memory cell 10 and readout arrangement 12 differs from a standard 4T pixel in that a light preventing means (not shown) substantially prevents light from impinging on the photodiode D1 to minimize leakage currents, which are also sometimes described as dark currents.

In the following description HIGH denotes a logic "1" level, which may be the power supply level and LOW denotes a logic "0" level, which may be the ground or lower voltage level than the HIGH voltage level. Absolute voltage values are given in parentheses, but are only used as an aid to demonstrate the principle of operation. The actual voltage values used may be different. Threshold voltages or other device parameters have not been described, and may be different for different processes.

Write Operation (4T Pixel Layout)

A write operation for both a "1" and a "0" to the memory cell 10 will now be described. To write a "1" to the memory cell 10, the following sequence may be implemented:
  (1) To begin, the following voltages are applied: VRT=HIGH (1.8V), RST=HIGH (3.5V), TX=HIGH (3.5V), READ=LOW (0V). The value of READ, that is whether it is high or low, does not affect the write phase. Under these conditions, treating the relevant transistors as switches, M3 and M2 are "on" and M0 is "off", resulting in the Bit Node (BN) voltage being set to the VRT supply voltage (1.8V) or the photodiode pinned voltage.
  (2) Next turn off M3, TX=LOW (0V).
  (3) Next turn off M2, RST=LOW (0V).

Under these conditions the Bit Node (BN) voltage is set to the VRT supply voltage (1.8V) or the photodiode pinned voltage (if a pinned photodiode is being used) and then isolated from the rest of the cell 10. Thus a "1" has been stored at the Bit Node.

To write a "0" to the memory cell 10 the following sequence may be implemented:
  (1) To begin, the following voltages are applied: VRT=LOW (0V), RST=HIGH (3.5V), TX=HIGH (3.5V), READ=LOW (0V). Under these conditions, treating the relevant transistors as switches, M3 and M2 are "on" and M0 is "off", resulting in the Bit Node (BN) voltage being set to the VRT supply voltage (0V).
  (2) Next turn off M3, TX=LOW (0V).
  (3) Next turn off M2, RST=LOW (0V).

Under these conditions the Bit Node (BN) voltage is set to 0V. Thus a "0" has been stored at the Bit Node.

Read Operation (4T Pixel Layout)

To read data from the memory cell 10, the following sequence may be implemented:
  (1) To begin the following voltages are applied: VRT=HIGH (1.8V), RST=HIGH (3.5V), TX=LOW (0V), READ=LOW (0V). Under these conditions, M3 is "off", M2 is "on" and M0 is "off", causing the Sense Node (SN) to be charged to 1.8V.
  (2) Next turn off M2, RST=0V, isolating the sense node from VRT.
  (3) Next turn on M3 and M0, TX=HIGH (3.5V), READ=HIGH (3.5V).

When reading a "1" from the memory cell 10 there will be no transfer of electrons from the Bit Node (BN) to the Sense Node (SN), as the Bit Node voltage has been set to the VRT supply voltage or the photodiode pinned voltage. Therefore, as no electrons are transferred to the Sense Node, there will be no reduction in the Sense Node voltage. The Sense Node drives the gate of the source-follower M1, and a current will flow once the read transistor M0 and the pull-down current source (ISINK) on the source of the read transistor M0 are turned on.

The voltage on the sense node SN is amplified to the output node VDATA. In this way a high value can be detected. The high value of VDATA will not be as high as the supply voltage, and therefore a sense amplifier may be used on the VDATA pin to detect the data and convert it to the full supply voltage.

When reading a "0" from the memory cell 10 electrons will be transferred as charge will be shared between BN, which is at 0V, and SN, which is at 1.8V, from the Bit Node BN to the Sense Node SN. The Sense Node voltage is defined by the number of electrons transferred from the BN to the SN capacitance. This transfer of electrons to the Sense Node SN causes the voltage on the Sense Node SN to fall. The Sense Node SN drives the gate of the source-follower M1, and a current will flow once the read transistor M0 and the pull-down current source ISINK on the source of the read transistor M0 are turned on. The reduced voltage on the Sense Node SN is amplified to the output node VDATA and results in a low value being present on VDATA. A sense amplifier will be required on the VDATA pin to detect the data and convert it to the ground voltage.

Multiple Memory Elements per Sense Node

Figure 2:
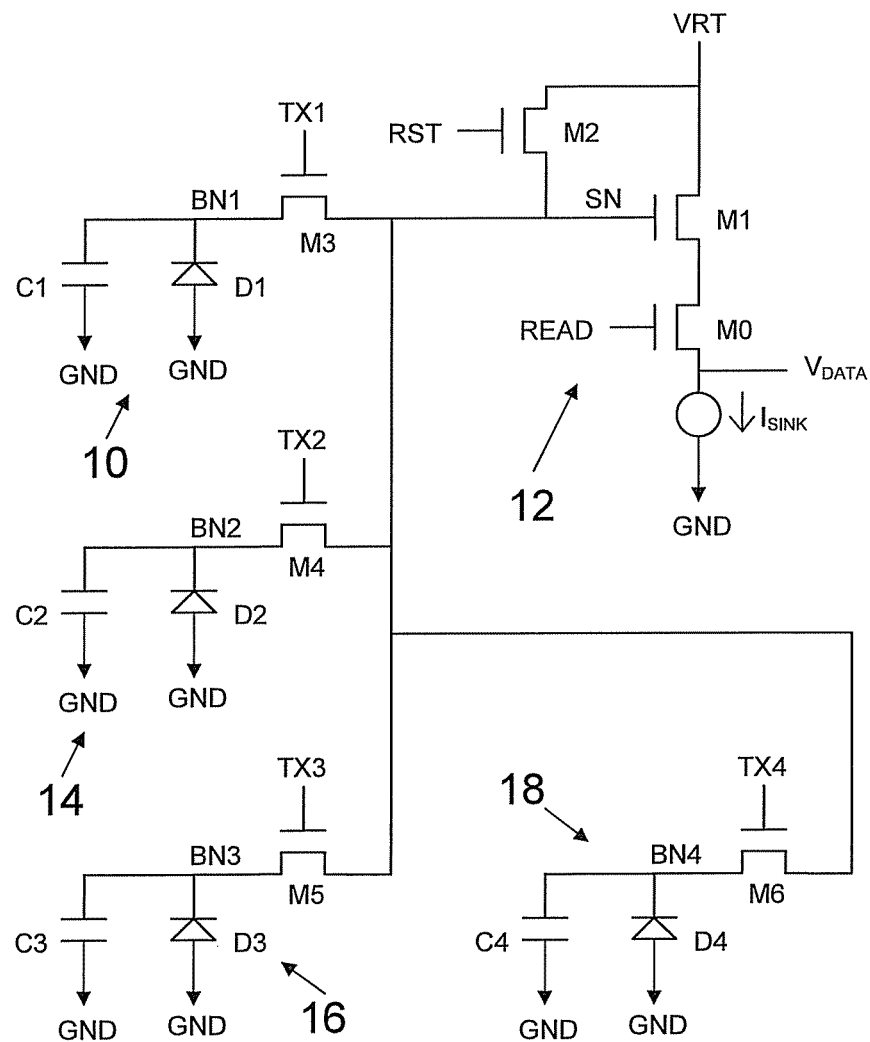
FIG. 2 is a schematic diagram of four memory elements using a further modified 4T pixel layout having three additional photodiodes and transfer gate pairs in accordance with the present invention.

The principle of operation that has been described above may be extended by sharing the Sense Node SN with multiple additional transfer gate transistors and photodiodes. Referring to FIG. 2, this principle is now described in more detail. A readout arrangement 12 is shown, which is identical to that of the readout arrangement of FIG. 1 and therefore like reference numerals are used. Furthermore, a memory element 10 is shown again with like reference numerals representing like features, except the bit node, which is now referred to as BN1 and the transfer gate signal, which is now referred to as TX1.

In addition, three more memory elements 14, 16, 18 are present. Each memory element 14, 16, 18 is connected to the sense node SN by their respective transfer gate transistors M4, M5 and M6. The structure of the memory elements 14, 16, 18 are identical to that of the memory element 10, that is, each having photodiodes D2, D3 and D4, representative capacitance C2, C3 and C4 and bit nodes BN2, BN3 and BN4. Reading and writing to these memory elements 14, 16 and 18 is performed in the same manner as described above for memory element 10, but applying the relevant transfer gate signal to the relevant transfer gate transistors M4, M5 or M6 using signals TX2, TX3 or TX4.

In this manner, more than one memory element may be associated with a readout arrangement 12, further reducing the semiconductor area required for each bit of stored data. Utilizing a single sense node and readout arrangement for multiple memory elements is not restricted to four memory elements, as shown here, but may be used with other numbers of memory elements. In some applications it may be more practical to keep the number of memory elements relatively small, as each memory element connected to a single sense node is addressed separately for read and write operations.

Figure 3:
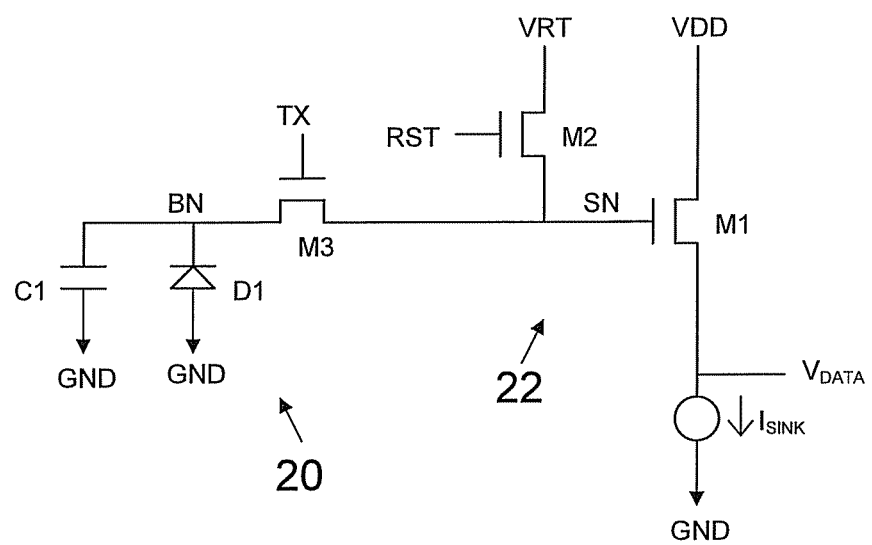
FIG. 3 is a schematic diagram of a memory element using a 3-transistor (3T) pixel layout in accordance with the present invention.

To demonstrate extension of the principle of operation of a memory element using the above-described pixel layout beyond a 4T pixel layout implementation, FIG. 3 shows a memory element 20 and a readout arrangement 22 in a conventional 3T pixel layout. In FIG. 3, like reference numerals are used to represent like features as described in relation to FIG. 1.

The differences between the memory element 10 and the memory element 20 are that the read transistor (M0) is no longer included, and the drain of the reset transistor M2 is separated from the drain of the source-follower M1. This means that there is now an additional signal line VDD connected to the drain of the source-follower M1. Once again, the memory element 20, or at least the photodiode D1, may be shielded from light to reduce the leakage currents.

Write Operation (3T Pixel Layout)

To write a "1" to the memory element 20 the following sequence may be implemented:
(1) To begin the following voltages are applied: VRT=HIGH (1.8V), RST=HIGH (3.5V), TX=HIGH (3.5V). Under these conditions the Bit Node (BN) voltage is set to the VRT supply voltage (1.8V) or the photodiode pinned voltage.
(2) Next turn off M3, TX=LOW (0V).
(3) Next turn off M2, RST=LOW (0V). Under these conditions the Bit Node BN voltage is set to the VRT supply voltage or the photodiode pinned voltage. Thus a "1" has been stored in the Bit Node BN.

To write a "0" to the memory element 20, the following sequence may be implemented:
(1) To begin the following voltages are applied: VRT=LOW (0V), RST=HIGH (3.5V), TX=HIGH (3.5V). Under these conditions the Bit Node BN voltage is set to 0V.
(2) Next turn off M3, TX=LOW (0V).
(3) Next turn off M2, RST=LOW (0V). Under these conditions the Bit Node BN voltage is set to 0V. Thus a "0" has been stored in the Bit Node BN.

Read Operation (3T Pixel Layout)

All memory elements that are not being read in the memory array should may have the following settings: VRT=LOW (0V), RST=HIGH (3.5V), TX=LOW (0V). In this way, the source-follower transistors M1 of memory elements not being read are turned off, and therefore will have no influence on the data being read.

To read data from the memory element 20, the following sequence may be implemented:
(1) To begin the following voltages are applied: VRT=HIGH (1.8V), RST=HIGH (3.5V), TX=LOW (0V), VDD=HIGH (1.8V). This causes the Sense Node SN to be charged to 1.8V.
(2) Next turn off M2, RST=LOW (0V).
(3) Next turn on M3, TX=HIGH (3.5V).

When reading a "1" from the memory element 20, there will be no transfer of electrons from the Bit Node BN to the Sense Node SN, as the Bit Node voltage has been set to the VRT supply voltage or the photodiode pinned voltage. Therefore, as no electrons are transferred to the Sense Node there will be no reduction in the Sense Node voltage. The Sense Node drives the gate of the source-follower M1, and a current will flow once the pull-down current source ISINK on the source of the source-follower transistor is turned on.

The sense node SN voltage is amplified to the output VDATA node. In this way a high value is present on VDATA. The high value of VDATA will not be as high as the supply voltage, and therefore a sense amplifier may be used on the VDATA pin to detect the data and convert it to the full supply voltage.

When reading a "0" from the memory element 20, electrons will be transferred from the Bit Node BN to the Sense Node SN. The Sense Node voltage is defined by the number of electrons transferred from the BN to the SN capacitance. This transfer of electrons to the Sense Node causes the voltage on the Sense Node to fall. The Sense Node drives the gate of the source-follower M1, and a current will flow once the pull-down current sources ISINK on the source of the source-follower transistor is turned on. The reduced voltage on the Sense Node is amplified to the output node VDATA. In this way, a low data value is present on VDATA. A sense amplifier may be used on the VDATA pin to detect the data and convert it to the ground voltage.

Multiple Memory Elements per Sense Node

The principle of operation that has been described above in relation to a 3T pixel layout may be extended, as described with reference to a 4T pixel layout, by sharing the Sense Node SN with multiple additional transfer transistors and photo diodes. The above description details the layout of individual memory elements using a pixel layout. As mentioned above, many memory elements will be positioned together in a memory array. To write data into the individual memory elements, the VRT line, which is usually common to all pixels in a pixel array, is split into a column or row bus. This allows the data to be written into the individual memory elements via the VRT bus. For some arrangements, it may also be useful to have multiple VRT lines per column.

Figure 4A:
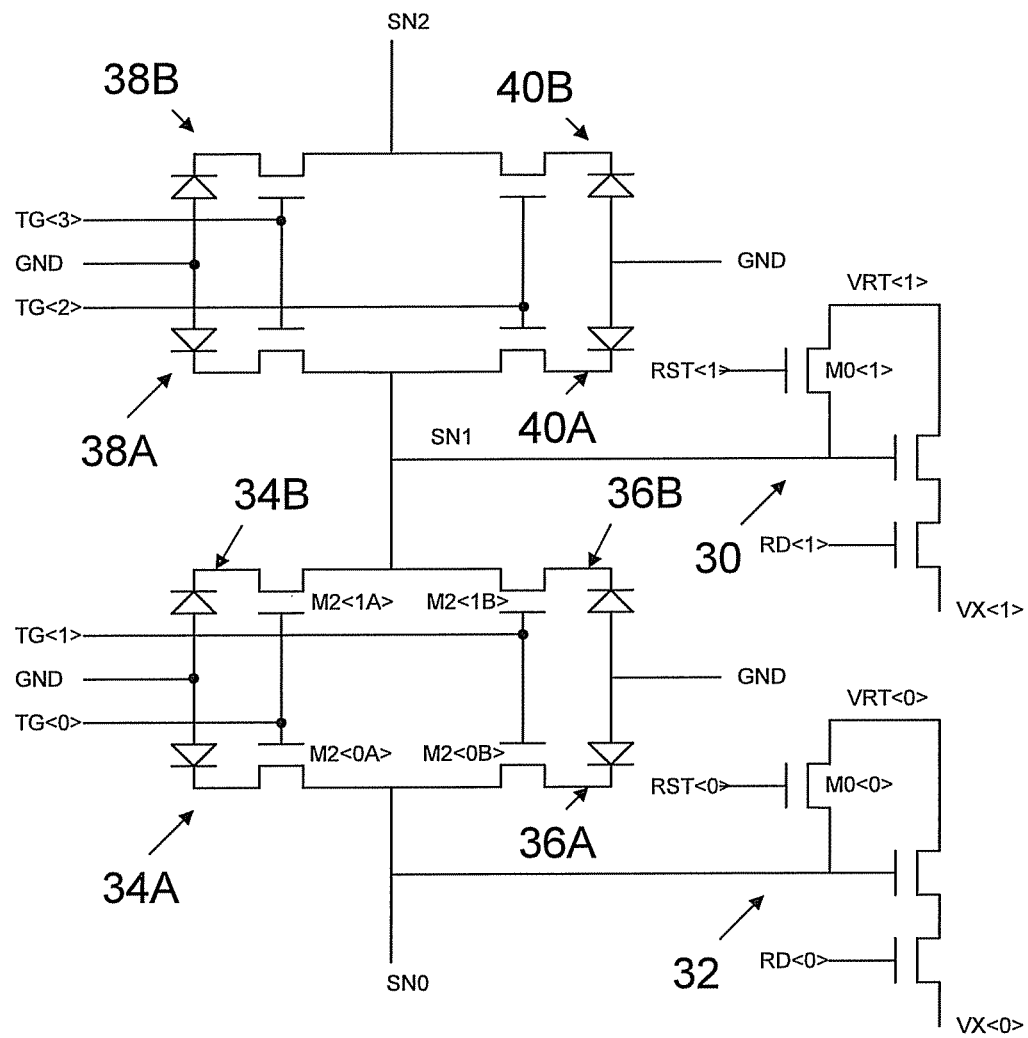
FIG. 4A is a schematic diagram of an alternative configuration of two further modified memory elements using 4T pixel layouts, having three additional photodiodes and transfer gate pairs, side by side, in accordance with the present invention.
Figure 4B:
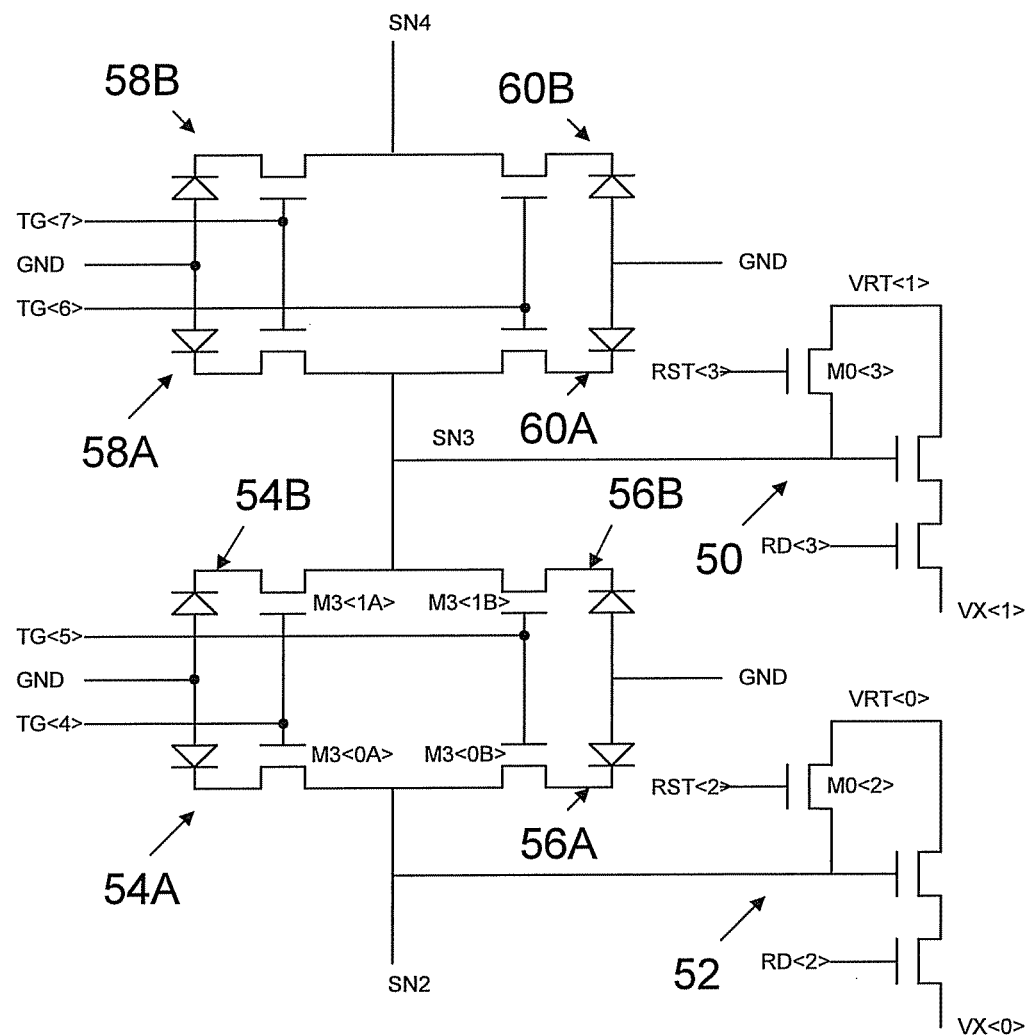
FIG. 4B is a continuation of the schematic diagram of FIG. 4A, showing further memory elements connected to nodes SN2, SN3 and SN4.

Accordingly, referring to FIG. 4A, a section of a memory array having four 2-bit memory locations is shown with two readout arrangements 30, 32 and, referring to FIG. 4B, a further section of the same memory array again having four 2-bit memory locations with two memory arrangements 50, 52. Readout arrangement 30 is connected to four memory elements 34B, 36B, 38A and 40A via a common sense node SN1. Readout arrangement 32 is shown connected to two memory elements 34A, 36A via a common sense node SN0, but may also be connected to two further memory elements in the same manner as readout arrangement 30. Two memory elements 38B, 40B are shown connected to a sense node SN2, which in turn is connected to a further readout arrangement 52 shown in FIG. 4B, which is also connected to memory elements 54A and 56A. FIG. 4B also has two further sense nodes SN3 and SN4 connected to further memory elements 54B, 56B, 58A, 60A, 58B and 60B. In the particular memory array of FIG. 4A, for example, a transfer gate signal TG<1> controls two transfer gate transistors M2<0B> and M2<1B> and a transfer gate signal TG<0> controls two transfer gate transistors M2<0A> and M2<1A>. Accordingly, each readout arrangement 30, 32, 50, 52 is alternately connected to a separate VRT line VRT<1> and VRT<0>. Separate VRT lines mean that the layout of the array may be modified slightly from a standard pixel array layout for use as memory.

Separate VRT lines are preferable because with a pixel array, a pixel was only required to be individually addressed on readout, which was typically done in parallel a row at a time. A row select signal, which would activate the read transistor, would be activated along with a transfer gate transistor and the pixel values would be readout. The VRT signal in a pixel array would remain "high" during the time that the pixel array was active and therefore was common across the whole pixel array.

As mentioned previously, the VRT lines in this context are bit lines and are used to write data to the bit node of the memory element. To enable a memory element to be individually addressed efficiently, the VRT lines are made common only to a row or column. It would be possible to write data to all memory elements with an array wide common VRT line by selecting the relevant transfer gate transistor and applying the relevant bit signal to the common VRT line. A more efficient arrangement, allowing parallel reading and writing of data, and allowing unique data to be stored in all possible memory locations, is to split the common VRT line to multiple VRT lines. In a typical pixel array, the transfer gate signal TX (in FIG. 1) is common to a row and therefore selects a pixel in each column when activated. In the example of FIG. 4A, a transfer gate signal, such as TG<1>, selects two memory locations, in this case 36A and 36B, in each column. As in this example, VRT<0> and VRT<1> are, separately, common across a column, selecting TG<1> and applying two data signals, one to VRT<0> and the other to VRT<1>, writes data to the memory locations 36A and 36B. For a large pixel array this would mean that two memory locations can be written to (or read from) per column in parallel.

Write Timing Diagram

Figure 5:
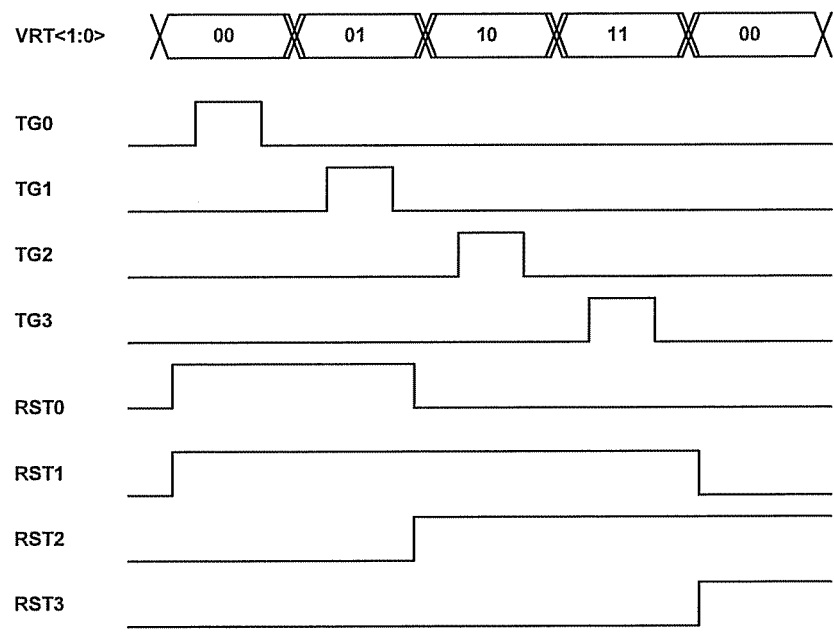
FIG. 5 is a timing diagram for writing data to the memory elements of FIG. 4A.

To better explain the operation of a memory array and memory elements as described herein, FIG. 5 shows an example of timings for signals required to write data. Once again the voltage values described are used as examples of values and other values may be used.

Firstly, to write data to a memory element the data should be provided on a VRT bus. Data is then stored in a particular memory location through turning on the appropriate TG and RST transistors.

For example, referring to FIG. 4A, to write a "1" to memory location 36A, VRT<0> is set to "1", which in this case is 2.5V, and RST<0> and TG<1> are set to high (3.5V in this case), turning on transistors M0<0> and M2<0B>. Setting TG<1> to 0 and then RST<0> to 0, stores the "1" at location 36A.

In FIG. 5, the timing is shown to write to the 2-bit locations of FIG. 4A. However, the timing diagram of FIG. 5 also refers to RST<2> and RST<3>, which are shown on FIG. 4B and represent signals for further reset transistors M0<2> and M0<3> of further readout arrangements identical to that of 30 and 32 repeated above that of the memory locations and readout arrangements shown.

Throughout the write procedure RD<0> and RD<1> are set low (0V) and corresponding signals RD<2> and RD<3> of readout arrangements 50 and 52 in FIG. 4B are also set low.

Each VRT line (VRT<1>, VRT<0>) is driven by a multiplexer that will drive one of three possible voltages onto the appropriate VRT line, 2.5V, 2.2V or 0V. 2.5V is used on the VRT line to write logic high data or when the memory is being read out. 2.2V is used on the VRT line when the memory is being read out, during the sense amplifier calibration stage. 0V is used on the VRT line to write logic low data to the memory cell. Note, in reality 0V would not be used but a value close to this but slightly higher, i.e. 100 mV. However, 0V will still be referred to in the following explanation.

So, referring again to FIG. 4A, FIG. 4B and FIG. 5, a first write operation is to store two "0"s at the two bit memory location 34A and 34B. VRT<0> and VRT<1> are set to low (0V in this case) and RST<0> and RST<1> are set to high (3.5V in this case). TG<0>, which was low meaning that transfer gate transistors M2<0A> and M2<1A> were "off", is then also set to high (3.5V in this case), turning M2<0A> and M2<1A> "on", before being set back to low. This stores a "0" at memory location 34A and 34B.

Then a second write operation is to store a "1" and a "0" at the two bit memory location 36A and 36B. VRT<0> is set to high and VRT<1> is set to low with RST<0> and RST<1> still set high from the previous write operation. TG<1>, which was low meaning that transfer gate transistors M2<0B> and M2<1B> were "off", is then also set to high, turning M2<0B> and M2<1B> "on", before being set back to low. This stores a "1" at memory location 36A and a "0" at memory location 36B.

A third write operation is to store a "1" and a "0" at the two bit memory location 40A and 40B. VRT<1> is set to high and VRT<0> is set to low with RST<0> going low, as it is no longer required, RST<1> still set high from the previous write operation and RST<2> also being set high. TG<2> is then set to high before being set back to low. This stores a "1" at memory location 40A and a "0" at memory location 40B.

A fourth write operation is to store two "1"s at the two bit memory location 38A and 38B. VRT<1> and VRT<0> are set to high with RST<1> and RST<2> still set high from the previous write operation. TG<3> is then set to high before being set back to low. This stores a "1" at memory locations 38A and 38B.

The same process can then be continued for remaining memory locations.

Read Timing Diagram

Figure 6:
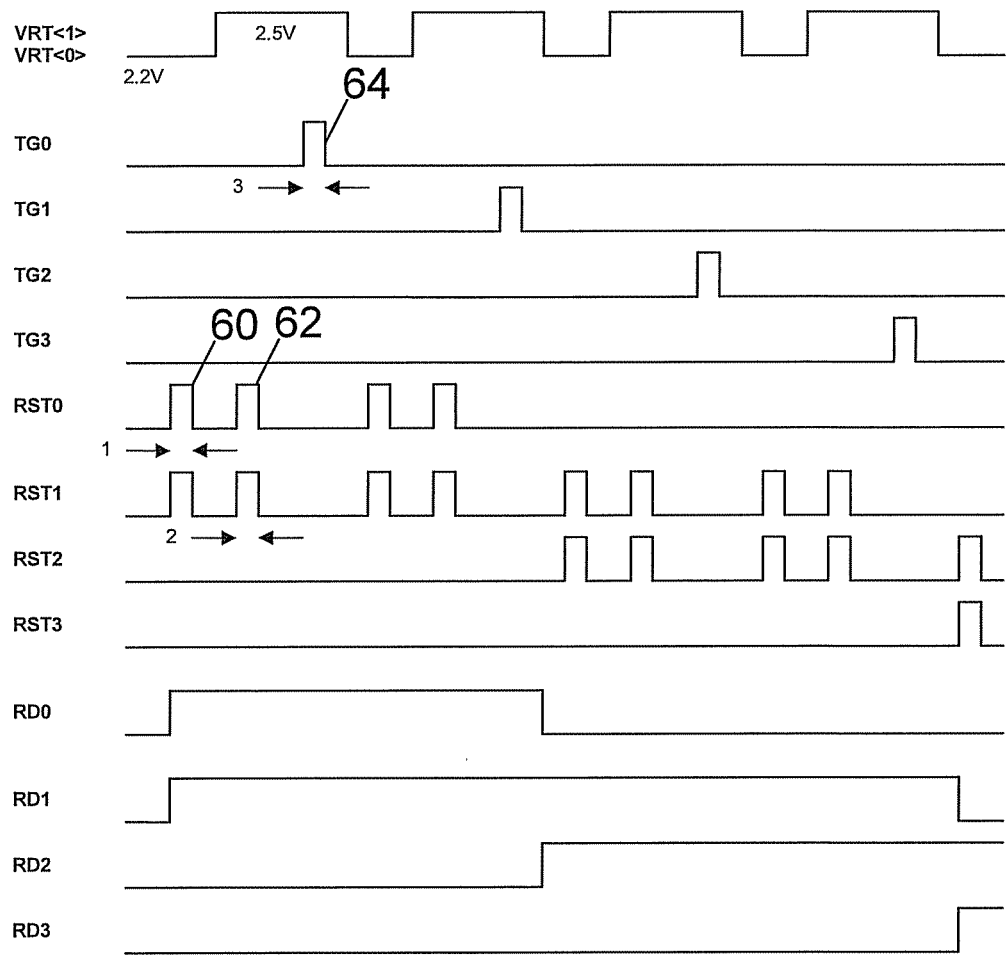
FIG. 6 is a timing diagram for reading data from the memory elements of FIG. 4A.

Referring to FIG. 6, signals TG<0> to TG<3>, RST<0> to RST<3> and RD<0> to RD<3> are shown and provide signals to the relevant components as previously described. VRT<0> and VRT<1> are also shown with the same signal being used on all VRT lines.

In this example, there is a read sequence comprising of three stages to read data from a memory location. This read sequence is then repeated for subsequent memory locations. It can also be seen that all VRT lines have the same waveforms present on them during the read sequence, where the voltage on the VRT lines, in this example, is either 2.2V or 2.5V.

2.2V is first applied to the VRT lines, in this example, because it is the nominal case average voltage found when summing a one and a zero. A one is represented by approximately 2.5V on the sense node following read out. A zero is represented by approximately 1.9V on the sense node following read out, as the sense node voltage will drop if the bit node is 0V (or is approximately 0V). Thus, the average value is 2.2V. We require 2.2V to calibrate the readout arrangement, which is operating as an amplifier, to the average value of the data in order to detect the data correctly. Thus, once calibrated the sense node will rise when reading a one (2.2V→2.5V) and fall when reading a zero (2.2V→1.9V). Thus, the sense amplifier will be able to detect the data on the bit node accordingly.

Referring again to FIG. 6, part 1 of the read sequence is required to calibrate the sense amplifier. A first RST pulse, such as RST<0> pulse 60, applies 2.2V to the sense node and then the VRT lines are set to 2.5V for sufficient time to allow the sense amplifier (or readout arrangement) to be correctly calibrated. In part 2 of the read sequence, a second RST pulse, such as RST<0> pulse 62, resets the sense node to 2.5V. Part 3 of the read sequence is where the TG (transfer gate) line pulses, such as TG<0> pulse 64, and data transfer from the bit node onto the sense node takes place, that is, the data is read out.

Further modifications and improvements may be made without departing from the scope of the present invention.

That which is claimed is:

1. A random access memory circuit comprising:
   a plurality of pixels each comprising
      a light sensing circuit, and
      a metal light blocking layer arranged over at least said light sensing circuit.

2. The memory circuit of claim 1 further comprising a plurality of bit lines coupled to at least one of said pixels.

3. The memory circuit of claim 2 wherein said plurality of pixels are arranged in an array of rows and columns.

4. The memory circuit of claim 3 wherein each of said bit lines is coupled to a respective column or row of said pixels.

5. The memory circuit of claim 1 wherein said light sensing circuit comprises a reverse-biased photodiode.

6. The memory circuit of claim 5 further comprising a transfer switching circuit coupled to said reverse-biased diode and defining at least one bit node therewith for storing data based upon operation of said transfer switching circuit.

7. The memory circuit of claim 6 wherein each pixel further comprises:
   an amplifier; and
   a reset switching circuit coupled to said amplifier and said transfer switching circuit and defining a sense node therebetween.

8. The memory circuit of claim 7 wherein each pixel further comprises a readout switching circuit connected to said amplifier.

9. The memory circuit of claim 8 wherein said amplifier comprises a source-follower transistor.

10. The memory circuit of claim 7 wherein said readout switching circuit is coupled to a conduction terminal of said source-follower transistor.

11. A random access memory circuit comprising:
    a plurality of memory elements for storing data, each memory element comprising
       a photodiode,
       a transfer switching circuit coupled to said photodiode and defining a bit node therebetween for data storage, and
       a metal light blocking layer arranged over said photodiode; and
    at least one memory access circuit for reading and writing data to and from said plurality of memory elements.

12. The memory circuit of claim 11 wherein said at least one memory access circuit comprises:
    an amplifier; and
    a reset switching circuit coupled to said amplifier and said transfer switching circuit and defining a sense node therebetween.

13. The memory circuit of claim 12 wherein said reset switching circuit comprises a reset transistor having a conduction terminal coupled to the sensing node.

14. The memory circuit of claim 12 wherein said amplifier has a gain of not more than unity.

15. The memory circuit of claim 12 wherein said amplifier comprises a source-follower transistor.

16. The memory circuit of claim 11 wherein said at least one memory access circuit comprises a read selection circuit.

17. The memory circuit of claim 11 wherein said plurality of memory elements are arranged in an array of rows and columns.

18. A method of using a plurality of pixels as a random access memory circuit, each pixel having a light sensing circuit and a metal light blocking layer arranged over the light sensing circuit, and a switching circuit coupled to the light sensing circuit and defining a bit node therewith, the method comprising:
    writing a set voltage to the bit node; and
    reading the set voltage from the bit node.

19. The method of claim 18 wherein the light sensing circuit comprises a reverse-biased photodiode.

20. The method of claim 19 wherein writing further comprises:
    turning on the switching circuit;
    applying the set voltage across the light sensing circuit and turning off the switching means; and
    storing the set voltage at the bit node.

21. The method of claim 20 wherein the switching circuit is coupled between the light sensing circuit and a sense node; and wherein reading further comprises:
    charging the sense node to a sense node voltage;
    isolating the sense node from further charging; and
    turning on the switching circuit and detecting a change in the sense node voltage.

* * * * *